United States Patent [19]

Okatani et al.

[11] 4,225,968
[45] Sep. 30, 1980

[54] ELECTRONIC TUNING TYPE RECEIVER HAVING A BAND DISPLAY AND NUMERICAL FREQUENCY DISPLAY

[75] Inventors: Masanao Okatani; Hiroshi Onishi; Yoshiaki Ishibashi; Reisuke Sato; Hisashi Suganuma; Tomohisa Yokogawa; Yoshiharu Ueki; Haruo Kama, all of Kawagoe; Tadashi Kosuga; Tadashi Ogawa, both of Tokorozawa, all of Japan

[73] Assignee: Pioneer Electronic Corporation, Tokyo, Japan

[21] Appl. No.: 931,222

[22] Filed: Aug. 4, 1978

[30] Foreign Application Priority Data

Aug. 8, 1977 [JP] Japan .................................. 52-94749

[51] Int. Cl.² ............................................. H04B 1/16
[52] U.S. Cl. ..................................... 455/154; 334/86
[58] Field of Search ............... 325/455, 452, 453, 457, 325/458, 459, 464, 468; 334/86, 87; 331/16, 17

[56] References Cited

U.S. PATENT DOCUMENTS

| | | | |
|---|---|---|---|
| 3,962,641 | 6/1976 | Suwa | 325/455 |
| 3,973,206 | 8/1976 | Haselwood | 325/455 |
| 3,996,540 | 12/1976 | Yamada | 325/455 |
| 4,040,719 | 8/1977 | Schievelhuth | 325/455 |

Primary Examiner—Benedict V. Safourek
Assistant Examiner—Tommy P. Chin
Attorney, Agent, or Firm—Sughrue, Rothwell, Mion, Zinn and Macpeak

[57] ABSTRACT

The present invention is an electronic tuning type receiver having a band display unit and a numerical frequency display unit. The numerical frequency display unit provides a visual numerical display of the frequency selected by the receiver. The band display unit provides a visual indication of the relationship of the selected frequency with respect to the frequency band being tuned by the receiver.

16 Claims, 10 Drawing Figures

FIG. 5
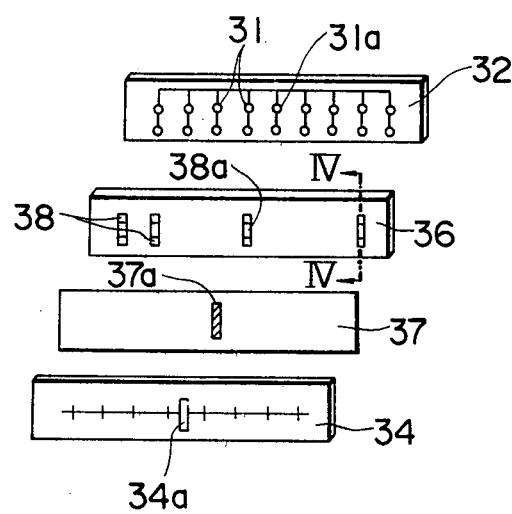
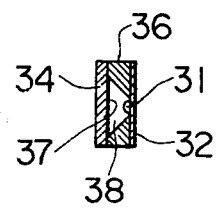
FIG. 6(a)
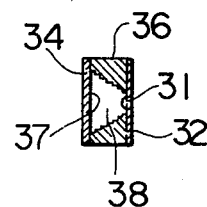
FIG. 6(b)

ELECTRONIC TUNING TYPE RECEIVER HAVING A BAND DISPLAY AND NUMERICAL FREQUENCY DISPLAY

BACKGROUND OF THE INVENTION

1. Field of the Invention

The present invention relates generally to electronic tuning type receivers, and more particularly, to a station selection display device in such a receiver where the selected station is visually displayed on a band display unit and a digital display unit.

2. Description of the Prior Art

Recently, as a result of the rapid progress in electronic technology, a receiver capable of electronically performing preset station selection has been proposed. In this preset type receiver, a memory is addressed by the outputs from band selecting and channel selecting switches, and the band and channel signals stored in the selected address of the memory are read out and provided to an up-down counter. The up-down counter also provides to the user the capability of manual tuning of the receiver.

In the present mode of operation, the digital output of the up-down counter is converted into an analog signal and is applied to an electronically-controlled variable capacitance diode (varactor diode). The variable capacitance diode is part of the tuning circuit of the receiver. Thus, the digital information read out from the selected address of the memory controls via the up-down counter the signal selected by the tuning circuit of the preset type receiver.

The channel selecting switches mentioned above are, for example, non-locking type push-button switches, while the band selecting switch is, for example, a rotary switch. Whenever these channel selecting switches and the band selecting switch provide channel and band selecting address signals to the memory, the band and channel signals stored in the selected address are outputted and provided to the up-down counter.

However, in the electronic tuning type receiver described above, a manually operated tuning knob is not used to select the frequency being received, and, thus, a conventional method of visually indicating the frequency of a station being received in correspondence to the amount of rotation of the manually operating knob cannot be employed.

SUMMARY OF THE INVENTION

The present invention is an electronic tuning type receiver having a band display unit and a numerical frequency display unit. The numerical frequency display unit provides a visual numerical display of the frequency selected by the receiver. The band display unit provides a visual indication of the relationship of the selected frequency with respect to the frequency band being tuned. In one example, the band display unit includes a plurality of light emitting diodes spaced approximately equal and defining a straight line. One of the light emitting diodes is lighted in response to each subportion of frequencies within the frequency band being tuned.

BRIEF DESCRIPTION OF THE DRAWINGS

FIG. 2(*b*) is an exploded side view taken along line I—I of FIG. 2(*a*);

FIG. 3(*b*) is a front perspective view of the lens member of the first embodiment of FIG. 3(*a*);

FIG. 3(*c*) is a front perspective view of the display plate of the first embodiment of FIG. 3(*a*);

FIG. 5 is an exploded front perspective view of the second embodiment of the display portion of the band display unit of the present invention;

FIG. 6(*a*) is a cross-sectional side view taken along line IV—IV of FIG. 5 of the first embodiment of the cavities provided by a light condensing plate, where each cavity includes a plurality of flat trapezoid surfaces; and FIG. 6(*b*) is a cross-sectional side view taken along line IV—IV of FIG. 5 of the second embodiment of the cavities provided by a light condensing plate, where each cavity includes a plurality of staircase trapezoid surfaces.

DETAILED DESCRIPTION OF THE INVENTION

Figure 1:
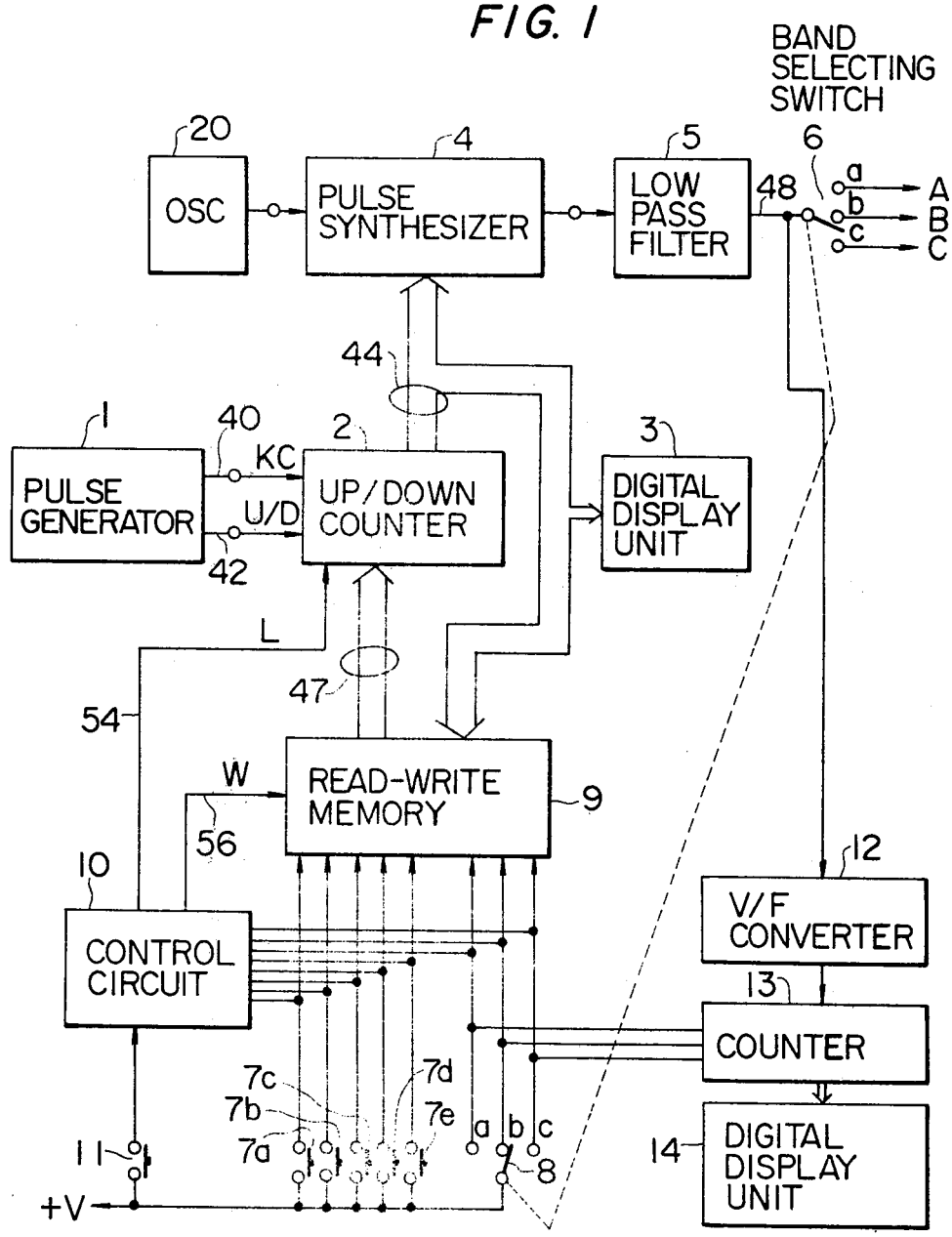
FIG. 1 is a block diagram of a electronic tuning type receiver of the present invention having a band display unit and a numerical frequency display unit.

Turning now to FIG. 1, one example of a station selection display device in an electronic tuning type receiver according to the present invention is now described.

A pulse generator 1 selectively generates an up-pulse, designated by the reference letter U, or a down-pulse, designated by the reference letter D, together with a clock pulse, designated by a reference letters KC, when the user manually tunes the receiver to select a desired frequency or signal. The up-pulse/down-pulse information and the clock pulse information is provided via lines 40, 42, respectively, to a binary up/down counter 2. Counter 2 counts the clock pulse in accordance with the information present on the up/down pulse line 42. The output count information from counter 2 is in a parallel format and is provided to a bus 44.

A digital display unit 3 is made up of, for example, thirty-two light emitting diodes arranged on one line and is adapted to receive from bus 44 the several higher significant bits of the count output from counter 2 to allow only one light emitting diode to emit light and, thus, to provide a digital visual display of the frequency being selected by the tuning circuit (not shown).

A pulse synthesizer 4 is adapted to receive from bus 44 the count output from counter 2. An oscillation signal generated by an oscillator 20 is provided to pulse synthesizer 4 and is frequency-divided thereby in accordance with the count output from counter 2 so that a serial pulse train having a pulse number which corresponds to the output of the counter 2 is provided at an output line 46 of pulse synthesizer 4. The serial pulse train on line 46 is provided to the input of a low-pass filter 5, which removes the high frequency components and provides on an output line 48 a DC voltage signal whose amplitude corresponds to the count output from counter 2. In other words, low-pass filter 5 acts as a digital-to-analog convertor of the serial pulse train on line 46. The DC voltage signal on line 48 is selectively applied via a band selecting switch 6, discussed in detail below, to the electronically-controlled variable capacitance diode (varactor diode) in the tuning circuit (not shown). Thus, the DC voltage signal on line 48 electronically controls the tuning of the receiver.

The band selecting switch 6 allows the user to select manually the desired band of frequencies for which the receiver is tuned. As shown in FIG. 1, switch 6 has three stationary contacts a, b, c for selecting bands A, B or C, respectively. Of course, switch 6 can have any desired number of stationary contacts. Switch 6 is associated in ganged fashion with a band selecting switch 8 which also has three stationary contacts a, b, c for selecting bands, A, B or C, respectively. As is the case of switch 6, switch 8 can also have any desired number of stationary contacts.

The read-write memory 9 operates to receive and latch the output of the band selecting switch 8 and the outputs of the channel selecting switches 7a through 7e so that the output of the up-down counter 2 is stored in an address specified by the outputs of the switch 8 and the switches 7a through 7e, or data stored in an address similarly specified are read and inputted to the up-down counter 2 via bus 47.

A control circuit 10 is also provided and is adapted to receive the outputs of the channel selecting switches 7a through 7e and the band selecting switch 8. When the presetting switch 11 is OFF, control circuit 10 provides a load signal L on a line 54 to the up-down counter 2 when the channel selecting switches 7a through 7e provide their outputs. On the other hand, when the presetting switch 11 is ON, control circuit 10 provides a write pulse W on a line 56 to the read-write memory 9 when the channel selecting switches 7a through 7e provide their outputs.

A voltage-to-frequency (V/F) converter 12 receives the voltage output of the low-pass filter 5 and is adapted to provide an output frequency signal corresponding to the tuning voltage from the low-pass filter 5.

A counter 13 is adapted to count the frequency signal output of the V/F converter 12 for a predetermined period of time. The counter 13 is designed, for example, so that the counting period of time is switched in response to a selection output of the band selecting switch 8, and the count value is increased as the band selecting switch 8 is switched to select a higher frequency band.

A digital display unit 14 is further provided to display the count value of the counter 13.

The operation of the electronic tuning type receiver of the present invention is now described.

When, for instance, an up-pulse U is generated by the users' manual operation of the pulse generator 1, the up-pulse U is applied to the up-down counter 2, as a result of which the up-down counter 2 carries out the up-count operation. The parallel count output of the up-down counter 2 is provided via bus 44 to the pulse synthesizer 4, where the oscillator signal from oscillator 20 is frequency divided in accordance with the signal on bus 44 and a serial pulse train, the number of pulses of which corresponding to the output of the up-down counter 2 is provided by line 46 to low pass filter 5. Low-pass filter 5 removes the high frequency components from the serial pulse train and provides a direct current voltage corresponding to the output of the up-down counter 2 via the band selecting switch 6 to a variable capacitance diode varactor diode in the tuning circuit (not shown). Thus, the desired receiving frequency is selected by the tuning circuit.

The higher bit signal from the up-down counter 2 is applied to the digital display unit 3 having thirty-two light emitting diodes arranged in a straight line, and one of the light emitting diodes is lighted in accordance with binary state of this higher bit signal. In this case, the output digital signal from the up-down counter 2 on bus 44 corresponds to the frequency of the selected receiving frequency. Therefore, the display unit 3 indicates in a linear fashion the position of the frequency being received with respect to the signal receiving range, that is, the signal receiving band selected by the position of band selecting switches 6 and 8.

On the other hand, the V/F converter 12 converts the tuning voltage provided by the low-pass filter 5 into a corresponding frequency signal which is applied to the counter 13. The counting condition of counter 13 is changed by the selection output of the band selecting switch 8, as shown in FIG. 1. For example, when the selected band is a high frequency, a high count value corresponding to the frequency of that band is obtained. That is, the count value of the counter 13 corresponds to the selected receiving frequency in the receiving band. The count output of the counter 13 is digitally displayed on the digital display unit 14, with each digit of the count output being displayed, for example, by a seven segment type numeral display device.

Thus, the relative position of the selected receiving frequency with respect to the receiving frequency band can be seen by observing lighted element in the band display unit 3, and the precise receiving frequency can be identified by observing the lighted numerical display of the digital display unit 14. Accordingly, the band display unit 3, for example, can be used for coarse tuning and the digital display unit 14, for example, can be used for fine tuning.

The electronic tuning and station selection display of the present invention in the manual tuning operation is as described above.

Now, the presetting station operation of the present invention is described. Under the condition that a desired station has been selected by the above-described manual operation, the preset switch 11 is first turned ON, and then one of the channel selecting switches 7a through 7e corresponding to a channel to be preset is turned ON. As a result, the write signal W is applied to the read-write memory 9 by the control circuit 10, so that the count output of the up-down counter 2, that is, a digital signal representative of a tuning frequency being received, is stored in an address which is specified by the band selecting switch 8 and the selected one of the channel selecting switches 7a through 7e. Other desired frequencies can be preset in similar fashion.

In preset station selection, an address where a digital signal corresponding to a desired station is stored is specified by operating the band selecting switch 8 and one of the channel selecting switches 7a through 7e. In this case, as the preset switch 11 is in OFF state, control circuit 10 supplies the load signal L to the up-down counter. As a result, the read-write memory 9 reads the signal stored in the address with the aid of the outputs of the band selecting switch 8 and the selected one of the channel selecting switches 7a through 7e, and the read out signal of the memory 9 is inputted, in a parallel mode, into the up-down counter 2, the output of which is applied to the pulse synthesizer 4. Thus, the station selection is carried out in a fashion similar to the operation in the manual operation. Thereafter, the preset station selecting change within the same band can be achieved merely by selectively operating one of the channel selecting switches 7a through 7e. Furthermore, if it is required to change the band with the same channel being maintained unchanged, only the band selecting switch 8 need be operated. In this operation, the control circuit 10 detects the OFF output of the band selecting switch operated to thereby control the up-down counter.

In this presetting station selection case, the band display unit 3 displays in a linear fashion the location of the selected frequency within the selected receiving frequency band, while the digital display unit 14 numerically displays the present receiving frequency in accordance with the position of the band selecting switch 8.

In the embodiment of the present invention described above, the tuning voltage signal from low-pass filter 5 on line 48 is converted into the corresponding frequency signal by V/F converter 12 and is applied to counter 13. It should be noted, however, that the present invention is not limited thereto. For example, the output frequency from the tuning circuit (not shown) may be subjected to frequency division and then applied to counter 13.

Figure 2A:
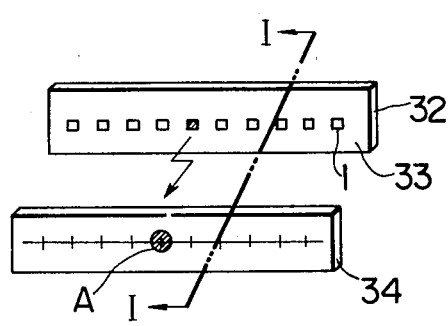
FIG. 2(*a*) is an exploded front perspective view of the display portion of the band display unit of the present invention in the general case.
Figure 2B:
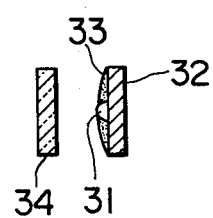

In the digital display unit 3, as shown in FIGS. 2(a) and 2(b), a plurality of light emitting diodes 31 are arranged on a substrate 32 provided with a mold member 33 made of transparent silicon resin, epoxy resin or the like. A transparent display plate 34 provided with graduations or a scale is disposed in front of the substrate 32. The light from each light emitting diode is projected onto the display plate 34, forming a light spot as indicated by a circular mark A, to thereby indicate a station selection position, as shown in FIG. 2(a). The configuration of the light spot is almost circular. Because of diffusion and reflection of light by the display plate 34 and the reflection of light by the surface of the mold member 33, halation of the projection light can result, which makes it difficult to visually recognize and differentiate the position of the light spot. If the present display unit 3 is employed in an automobile radio, the brightness of the light spot must be selected so that it can be seen in the inside the automobile during the day. This light level, however, may result in the brightness of the digital display unit 3 being too great at night.

Accordingly, it is preferable to employ a display unit 3 in which a display light spot on a display plate 34 has a configuration which can be readily recognized visually and has a clear contour.

Preferred examples of the display unit 3 for use in the present invention are now described.

Figure 3A:
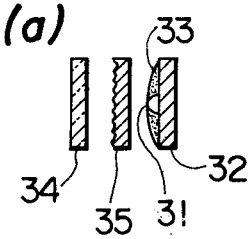
FIG. 3(*a*) is an exploded side view of the first embodiment of the display portion of the band display unit of the present invention.
Figure 3B:
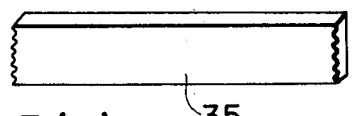

FIG. 3 shows a first example of the display unit 3, in which a lens member 35 is provided between the substrate and the transparent display plate 34. As shown in FIG. 3(b), the lens member 35 is a transparent plate which is equal in size to the display plate 34. A plurality of grooves are cut in the surface of the lens member 35 which confronts the substrate 32 or the display plate 34, and the grooves extended longitudinally with respect to the display plate 34. The cross-section of each groove may be V shaped, or circular or any other suitable configuration.

Figure 3C:
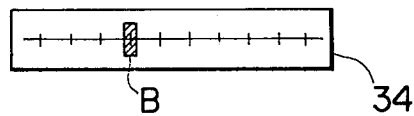

When a pencil beam of light from a light emitting diode 31 on the display unit passes through the lens member 35, it is diffused in a direction substantially perpendicular to the longitudinal direction of the display unit, as a result of which it is projected in the form of a rectangular light spot B on the front surface of display plate 34, as indicated in FIG. 3(c). Thus, the rectangular light spot B can be readily recognized.

If the surface of the bonding members 33 is coated with a color which readily absorbs the light from the light emitting didoes 31 (the color being black or green if the light from the light emitting diodes 31 is red), or if the peripheral portion of each light emitting diode 31 is masked with a color which blocks the passage of the light of the light emitting diode so as to make clear the contour of the light from the light emitting diode and to suppress the generation of unwanted reflection light, then the contour of the light spot on the display plate 4 is made more definite visually.

The distances between lens member 35, substrate 32 and display plate 34 and the number of grooves in the lens member 35 and the size of each groove may be suitably selected to produce a light spot on the display plate 34 of a desired size and shape.

Figure 4:
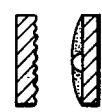
FIG. 4 is an exploded side view of the display portion of the band display unit of the present invention where the lens member and display plate are one integral unit.

The second example of the display unit 3 of the present invention is shown in FIG. 4. This example is similar to the above-described example shown in FIG. 3 with the exception that the display plate 34 and the lens member 35 form one unit. A lens member 35 having grooves extended perpendicularly to the direction of arrangement of the light emitting diodes 31 may be employed, depending on the configuration of the display plate 32 and the scale arrangement.

The third example of the display unit 3 of the present invention is now described with reference to FIGS. 5, 6(a) and 6(b). Like reference numerals in the third example designate the same parts in FIGS. 3(a) through 3(c). As in the other examples of the display unit 3, the light emitting diodes 31 are embedded in substrate 32 at predetermined positions thereon. A light conducting plate 36 and a filter 37 are sandwiched between the substrate 32 and the display plate 34. Rectangular slit-shaped through-holes 38 are provided at positions in the light condensing plate 36 which are in coincidence with receiving frequencies. For example, four slit-shaped through-holes 38 are shown in FIG. 5. Each slit-shaped through-hole 38 has an opening on the side of the substrate 32, as shown in FIG. 6(a), with the size of the opening being slightly larger than the outside diameter of the respective light emitting diode 31. The opening is extended in the form of a sector towards the filter 37. That is, the section of the through-hole 38 is tapered in the form of a trapezoid, as shown in FIGS. 6(a) and 6(b). The filter 36 is molded in the form of a resin film and provides a clear contrast with the color of the light emitted from the light emitting diode 31. For example, if the color of the light from the light emitting diodes 31 is read, it is preferable that the filter 36 be violet in color. The elements are sandwiched together, as shown in FIG. 6(a), to form a display unit 3. When the light emitting diode 31a on the substrate 32 in the display unit 3 thus constructed is caused to emit a light beam, the light beam is condensed by the respective slit-shaped through-hole 38a in the light condensing plate 36 and is reflected by the tapered surfaces of the slit-shaped through-hole 38a to thereby form a vertically-elongated slit-shaped light pencil. This light pencil is applied to the filter 37, as a result of which a vertically-elongated slit-shaped violet light pencil is formed at a position on the filter 37 which corresponds to the position of the slit-shaped through-hole 38a. Consequently, a vertically-elongated slit-shaped light pencil 34a is applied to the respective position on the display plate 34.

The degree of light condensing provided by the slit-shaped through-holes 38 in the light condensing plate 36 may be increased by the following method. As shown in FIG. 6(a), the tapered surfaces of each slit-shaped through-hole described above are flat; however, in this method, the tapered surfaces of each slit-shaped through-hole are made to be in the form of a staircase as shown in FIG. 6(b) so that all of the light beam from the light emitting diode are condensed onto the filter 37.

As is apparent from the above description, according to this example, the light condensing plate 36 adapted to condense the light beams from the light emitting diodes 31 is provided between the display plate 34 and the substrate 32 on which the light emitting diodes 31 are arranged. Therefore, the directivity of the light beams applied to the display plate is considerably increased. Furthermore, according to this example, the color filter 37 which is clearly in contrast with the color of light from the light emitting diodes 31 is employed. Consequently the halation phenomenon is never produced even if the display unit 3 according to this invention is operated in a dark environment. That is, the light pencil from each light emitting diode 3 is clearly distinguished from its circumferential brightness by the use of the color filter 37, which markedly reduces the variations in display brightness of the display plate 34. Accordingly, the display unit 3 according to the present invention can be employed with the tuner of an automobile radio, especially when the radio is operated at night.

What is claimed is:

1. In an electronic tuning type receiver including a digitally controlled preset tuning system, in which a digital signal for a band and a channel selection are supplied from a counter means having a plurality of stages to a digital-to-analog converter so as to obtain a D.C. voltage signal corresponding to said digital signal, said D.C. voltage being applied to a tuning means of said receiver to select a desired frequency band and to tune to a desired channel frequency within said desired frequency band, the improvement comprising:
   first display means responsive to said digital signal for visually displaying the relative position of said channel frequency being received with respect to said desired frequency band;
   counter means responsive to said tuning means for providing a count signal in accordance with said selected frequency band and said selected channel frequency; and
   second display means responsive to said count signal for visually displaying numerically the sum total of said frequency of said selected frequency band and said selected channel.

2. The electronic tuning type receiver as recited in claim 1, wherein said first display means includes a plurality of light emitting diodes arranged on a substrate, said light emitting diodes responsive to said digital signal.

3. The electronic tuning type receiver as recited in claim 2, wherein said plurality of light emitting diodes are spaced approximately equally and define a straight line, and wherein said first display means further includes a mold member having a plurality of openings, each of said light emitting diodes disposed between said substrate and said mold member adjacent one of said plurality of openings.

4. The electronic tuning type receiver as recited in claim 3, wherein said first display means further includes a display plate disposed on the side of said mold member away from said light emitting diodes.

5. The electronic tuning type receiver as recited in claim 4, wherein said first display means further includes a lens member disposed between said display plate and said mold member.

6. The electronic tuning type receiver as recited in claim 5, wherein said lens member includes a plurality of parallel grooves in one of the surfaces thereof, each groove having a centerline which is substantially parallel to said straight line defined by said light emitting diodes.

7. The electronic tuning type receiver as recited in claim 3, wherein said substrate in the areas adjacent said light emitting diodes is of a color which substantially absorbs the light emitting by said light emitting diodes, whereby the generation of unwanted reflected light is substantially suppressed.

8. The electronic tuning type receiver as recited in claim 5, wherein said display plate and said lens member is one unit.

9. The electronic tuning type receiver as recited in claim 8, wherein said lens member includes a plurality of parallel grooves in one of the surface thereof, each groove having a centerline which is substantially parallel to said straight line defined by said light emitting diodes.

10. The electronic tuning type receiver as recited in claim 2, wherein said first display means further includes,
   a light condensing plate disposed on the side of said substrate having said plurality of light emitting diodes and providing a separate cavity for each said light emitting diode,
   a light filter disposed on the surface of said light condensing plate away from said substrate, and
   a display plate disposed on the surface of said light filter away from said substrate.

11. The electronic tuning type receiver as recited in claim 10, wherein each said cavity includes a plurality of flat trapezoid surfaces.

12. The electronic tuning type receiver as recited in claim 10, wherein said cavity includes a plurality of staircase trapezoid surfaces.

13. The electronic tuning type receiver as recited in claim 10, wherein said light filter is a transparent color different from the color of said light emitted by said light emitting diodes.

14. In an electronic tuning type receiver including a digitally controlled preset tuning system, in which a digital signal for a band and a channel selection are supplied from a counter means having a plurallity of stages to a digital-to-analog converter so as to obtain a D.C. voltage signal corresponding to said digital signal, said D.C. voltage being applied to a tuning means of said receiver to select a desired frequency band and to tune to a desired channel frequency within said desired frequency band, the improvement comprising:
   first display means responsive to said digital signal for visually displaying the relative position of said channel frequency being received with respect to said desired frequency band;
   voltage-to-frequency means responsive to said D.C. voltage for providing a frequency signal in accordance with said D.C. voltage,
   counter means responsive to said frequency signal for providing a count signal in accordance with said frequency signal, and second display means responsive to said count signal for visually displaying numerically the sum total of said frequency of said selected frequency band and said selected channel.

15. In an electronic tuning type receiver including a digitally controlled preset tuning system, in which a digital signal for a channel selection within the frequency band of the receiver is supplied from a counter means having a plurality of stages to a digital-to-analog converter so as to obtain a D.C. voltage signal corresponding to said digital signal, said D.C. voltage being applied to a tuning means of said receiver to tune to a desired channel frequency within said frequency band, the improvement comprising:

first display means responsive to said digital signal for visually displaying the relative position of said channel frequency being received with respect to said frequency band;

counter means responsive to said tuning means for providing a count signal in accordance with said selected channel frequency; and second display means responsive to said count signal for visually displaying numerically the sum total of said frequency of said frequency band and said selected channel.

16. In an electronic tuning type receiver including a digitally controlled preset tuning system, in which a digital signal for a channel selection within the frequency band of the receiver is supplied from a counter means having a plurality of stages to a digital-to-analog converter so as to obtain a D.C. voltage signal corresponding to said digital signal, said D.C. voltage being applied to a tuning means of said receiver to tune to a desired channel frequency within said frequency band, the improvement comprising:

first display means responsive to said digital signal for visually displaying the relative position of said channel frequency being received with respect to said frequency band;

voltage-to-frequency means responsive to said D.C. voltage for providing a frequency signal in accordance with said D.C. voltage;

counter means responsive to said frequency signal for providing a count signal in accordance with said frequency signal; and second display means responsive to said count signal for visually displaying numerically the sum total of said frequency of said frequency band and said selected channel.

* * * * *